(12) United States Patent
Dobler

(10) Patent No.: US 7,064,996 B2
(45) Date of Patent: Jun. 20, 2006

(54) REFRESHING DYNAMIC MEMORY CELLS IN A MEMORY CIRCUIT AND A MEMORY CIRCUIT

(75) Inventor: Manfred Dobler, Ergoldsbach (DE)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 10/817,469

(22) Filed: Apr. 2, 2004

(65) Prior Publication Data

US 2004/0246802 A1    Dec. 9, 2004

(30) Foreign Application Priority Data

Apr. 2, 2003    (DE) ................. 103 15 087

(51) Int. Cl.
*G11C 7/00*    (2006.01)

(52) U.S. Cl. ................. 365/222; 365/149; 365/202

(58) Field of Classification Search ............... 365/222, 365/149, 202
See application file for complete search history.

(56) References Cited

U.S. PATENT DOCUMENTS 5,764,562 A * 6/1998 Hamamoto ................. 365/149
2002/0186609 A1 * 12/2002 Tsubouchi et al. ...... 365/230.03

FOREIGN PATENT DOCUMENTS

JP    5-135576    6/1993

OTHER PUBLICATIONS

Sanghoon Hong, et al., "Low-Voltage DRAM Sensing Scheme With Offset-Cancellation Sense Amplifier", IEEE Journal of Solid-State Circuits, vol. 37, Issue 10, Oct., 2002, pp. 1356-1360.

* cited by examiner

*Primary Examiner*—Huan Hoang
(74) *Attorney, Agent, or Firm*—Patterson & Sheridan, L.L.P.

(57) ABSTRACT

Methods and apparatus for refreshing a dynamic memory cell in a memory circuit are provided, wherein the required time between refresh operations may be increased by increasing the potential difference between a high charge potential and common center potential used during a refresh mode relative to the potential difference between the high charge potential and the common center potential used during read or write modes.

19 Claims, 3 Drawing Sheets

REFRESHING DYNAMIC MEMORY CELLS IN A MEMORY CIRCUIT AND A MEMORY CIRCUIT

CROSS-REFERENCE TO RELATED APPLICATIONS

This application claims foreign priority benefits under 35 U.S.C. §119 to co-pending German patent application number 103 15 087.0, filed Apr. 2, 2003. This related patent application is herein incorporated by reference in its entirety.

BACKGROUND OF THE INVENTION

1. Field of the Invention

The invention relates to a method for refreshing dynamic memory cells in a memory circuit. Furthermore, the invention relates to a memory circuit having a memory cell array and having a refresh circuit for refreshing the memory cells.

2. Description of the Related Art

A dynamic memory cell usually has a storage capacitance, which can be connected to a bit line in switchable fashion via a memory transistor. The memory transistor is driven via a word line, the opening or blocking of the memory transistor being prescribed in accordance with an activation signal. During the read-out of the memory cell, first of all the memory transistor is opened by means of the activation signal and the charge stored in the storage capacitance flows onto the bit line connected to the memory cell.

In a dynamic memory circuit, bit lines are in each case arranged in pairs, an activation signal causing a storage capacitance to be connected only to one of the bit lines of a bit line pair. The flowing of the charge of the storage capacitance onto the bit line brings about a charge potential difference on the bit lines of the bit line pair, which is amplified by a sense amplifier connected to the bit line pair. In this case, the charge potential of the bit line which has the lower potential is charged to a low charge potential and the potential of the bit line which has the higher potential is charged to a high charge potential. As a result, on the one hand, the low storage charge is amplified in such a way that a signal can be read out at an output of the sense amplifier and, on the other hand, the stored signal is written back to the memory cell read, so that the stored charge information is not lost after the charge information has been read out from the memory cell. The memory cell loses charge, and thus the information stored in it, not only during access to the memory cell but also through leakage currents. For this reason, every memory cell of an integrated circuit regularly has the information stored in it written to it anew. This operation is called refreshing.

The memory cell is refreshed essentially by means of an activation of the corresponding word line, the charges flowing from the storage capacitances of the memory cells connected to the word line onto a respective one of the bit lines of the bit line pairs that cross the word line. The resulting charge difference on the bit lines is amplified by the respective sense amplifiers, the potential of the bit line connected to the memory cell being charged to a high or low charge potential depending on the charge information stored in the memory cell. By virtue of the fact that the word line remains activated for the time period in which the sense amplifier amplifies the charge difference, the charge can flow back from the amplified potential of the bit line into the memory cell.

The refreshing of the memory cells is repeated at regular intervals, so that charge losses in the storage capacitances on account of the leakage currents or the like do not lead to a loss of the charge information. The time duration between the refresh operations on a word line is chosen such that the contents of the memory cells can be reliably read out during each refresh operation.

The cyclic refresh operations in a memory circuit having dynamic memory cells substantially determine the current consumption of a dynamic memory circuit. In this case, the current consumption is only partially determined by the charges which are written to the memory cells. Another significant factor of the current consumption consists in the current taken up by peripheral drive circuits and essentially depends on the frequency of the periodic driving of the word lines.

The current consumption is a significant factor for dynamic memory circuits. Mobile applications, in particular, require the current consumption to be reduced as far as possible. Since, in particular, the refreshing of dynamic memory cells constitutes a considerable factor in the current consumption, it is therefore an object of the present invention to provide a current-saving method for refreshing dynamic memory cells. It is furthermore an object of the present invention to provide a memory circuit having a refresh circuit which has a current consumption that is as low as possible.

SUMMARY OF THE INVENTION

A first aspect of the present invention provides a method for refreshing a dynamic memory cell in a memory circuit. The memory circuit has memory cells arranged at a word line and a bit line of a bit line pair. After the read-out, the potentials of the bit lines of the bit line pair are charged to a common center potential. During the read-out of the memory cell, the word line is activated and a charge difference brought about thereby on the bit lines of the bit line pair is separated into a high charge potential and a low charge potential. During the refresh of the memory cell, the word line is activated. The charge potential of the bit lines of the bit line pair are separated, depending on the charge information of the memory cell, in the direction of a high refresh potential and a low refresh potential. After the refresh of the memory cell, the word line is deactivated and the potentials of the bit lines of the bit line pair are charged to a refresh center potential. The potential difference between the high refresh potential and the refresh center potential is greater than the potential difference between the high charge potential and the common center potential.

The method according to the invention has the advantage that, during the refresh, the charge information is stored for a longer time in the memory cell during refresh operations than during normal read/write operations. By virtue of increasing the potential difference between the high refresh potential and the refresh center potential, the high refresh potential requires, for the same leakage current behavior, a longer time to reach the refresh center potential than with respect to a potential difference between the high charge potential and the common center potential. Consequently the charge stored in the memory cell is stored longer, so that the memory cell has to be refreshed less frequently. In other words, the refresh frequency with which the memory cells are refreshed can thus be reduced.

Since the current consumption of integrated memory circuits depends to a great extent on the refresh frequency, it is thus possible to reduce the current consumption in a memory circuit. This is possible since the current consumption is determined not only by the charge introduced into the memory cells but also by peripheral drive circuits operated at the same frequency, i.e. the refresh frequency. While the charge written to the memory cell, i.e. to the storage capacitor, is essentially linearly dependent with the possible minimal refresh frequency and, consequently, it is not possible to achieve a reduction in the current consumption, due to the change introduced into the memory cells. However, it is possible to significantly reduce in particular the current consumption of the peripheral circuits, e.g. for driving the memory cells.

Preferably, the high refresh potential for refreshing the charge information items of the memory cells is greater than the high charge potential for reading out the information from an addressed memory cell. This represents a simple possibility for increasing the charge difference between the high refresh potential and the refresh center potential, since, for the refresh operation, it is necessary to make available to the sense amplifier merely a potential which is greater than the high charge potential, e.g. for reading from or writing to the memory cells.

A further possibility for increasing the potential difference consists in reducing the refresh center potential with respect to the common center potential during the read-out of the memory cell. In this way, the high refresh potential and the high charge potential may be chosen to be identical and, at the same time, it is possible to increase the retention time of the information in the memory cells.

As an alternative, the center potential may lie in the center between the low and the high refresh potential, so that the separation into a high and a low refresh potential can be carried out essentially symmetrically with respect to the center potential.

Preferably, the word line remains activated for a shorter time duration during the refresh than during the read-out of one of the memory cells at the word line. Since the word line is usually activated at a high potential, leakage currents flow from the word line, so that it is necessary to maintain the high potential of the word line. If the word line is activated for a shorter time duration, then the time duration in which leakage currents flow away from the word line can be reduced. It is also possible in this way to reduce the current consumption of the word line decoder which activates the word line in accordance with the activation signal.

It may be provided that the refresh of the memory cell is carried out in a self-refresh operation. A self-refresh operation is started if the memory circuit is not accessed for a relatively long time. A self-refresh circuit provided in the memory circuit then ensures that the refreshing is performed by the memory circuit itself without external control.

As an alternative, the center potential may also lie in the center between the low and the high charge potential, as are used during the read-out of memory cells.

The refresh period after which memory cells at a word line are periodically refreshed is preferably increased only after the first refresh after a write and/or read access to the relevant memory cells, since it is only then that the increased potential difference between the high refresh potential and the refresh center potential is available to the memory cells. This applies in particular if the high refresh potential is increased with respect to the high charge potential.

A further aspect of the present invention provides a memory circuit having a memory cell array having a memory cell arranged at a word line and a bit line pair. The memory circuit has a refresh circuit for refreshing the memory cell. For refreshing the memory cell, the refresh circuit activates the word line in order to apply the charge information items of the memory cell to one of the bit lines of the bit line pair. The bit line pair is connected to a sense amplifier in order to separate the charge difference between the bit lines of the bit line pair into a high charge potential and a low charge potential. The refresh circuit is furthermore configured in such a way as to apply a high refresh potential and a low refresh potential to the sense amplifier during the refresh, so that, during the refresh, the potential of one of the bit lines of the bit line pair is charged in the direction of the high refresh potential and the potential of the other bit line of the bit line pair is charged in the direction of the low refresh potential. In this case, according to the invention, the high refresh potential is greater than the high charge potential.

In this way, for refreshing purposes, the bit line which, after the activation of the word line, acquires a higher potential on account of the charge flow from the memory cell is pulled to a higher voltage potential than the high charge potential which is usually achieved during the read-out of the relevant memory cell. Since the word line remains activated until the bit line with the high refresh potential has essentially almost or completely reached the high refresh potential, this potential is written back to the memory cell, i.e. the storage capacitor. A higher charge in the memory cell has the consequence that the potential difference between the memory cell charge and the center potential charged onto the bit lines after the deactivation of the word line is greater than when reading from and/or writing to the memory cell and the memory cell thus retains the charge information for longer than a memory cell which is charged only to the high charge potential. In this way, the charge information stored in the memory cell can be stored more reliably.

It may be provided that the refresh circuit carries out a first refresh of the memory cell after a first time duration after a write/read access to the memory cell and carries out a further refresh of the memory cell after a second time duration, the first time duration being less than the second time duration. The first time duration is determined by the maximum time in which the charge information of the memory cells can be read out reliably. Since the memory cell, i.e. the storage capacitor, can be charged at most with a high charge potential after the write/read access, the first refresh of the memory cell must be effected after a first time duration after which the charge information of the memory cell is not lost. Since the first refresh is effected with a high refresh potential, it is necessary—in the case where the memory cell is to be charged with a high potential in accordance with the information to be stored—to carry out the first refresh after a shorter time duration than the subsequent further refresh operations.

It may be provided that the refresh circuit, during the refresh of the memory cell, leaves the word line activated only until that bit line of the bit line pair which has the higher potential has a charge potential which is higher by a defined potential magnitude, as after a write/read access during which a high charge potential is written to the memory cell. This makes it possible to ensure that the charge information of the memory cell is retained for longer during the refresh operation. Moreover, as a result of the shorter time duration in which the word line is activated, it is possible to reduce the leakage currents on the word line in the activated state since the word line is at a high potential only for a shorter time duration.

A further aspect of the present invention provides a further memory circuit. The memory circuit has a charge equalization device in order to charge the bit lines of the bit line pair to a common center potential after the memory cell has been read from and/or written to. The refresh circuit is connected to the charge equalization device in such a way as to charge the bit lines of the bit line pair to a refresh center potential after a refresh of the memory cell. In this case, the refresh center potential is chosen to be less than the common center potential. This also makes it possible to increase the potential difference between the high refresh potential and the potential detected with respect to the charge information of the memory cell during the refresh, so that the charge is retained for longer. This does not require that the high refresh potential be chosen to be greater than the high charge potential, so that it is not necessary to increase the circuit construction in the driving of the sense amplifier.

BRIEF DESCRIPTION OF THE DRAWINGS

A preferred embodiment of the invention is explained in more detail below with reference to the accompanying drawings, in which.

DETAILED DESCRIPTION OF THE PREFERRED EMBODIMENT

Figure 1:
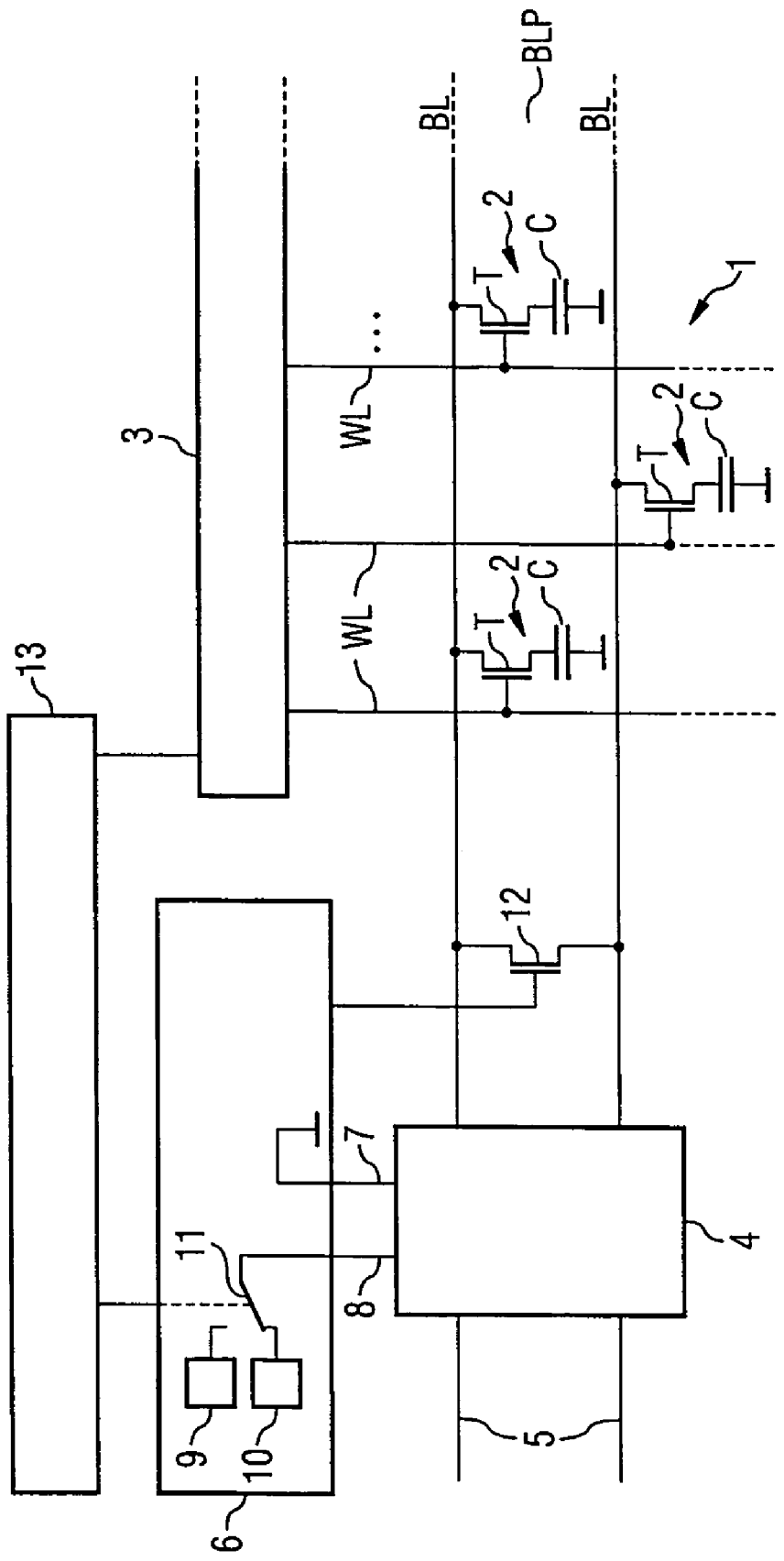
FIG. 1 shows a detail from a memory circuit according to the invention.

FIG. 1 illustrates a detail from a memory circuit according to the invention. The memory circuit has a memory cell array 1, in which memory cells 2 are arranged at word lines WL and bit line pairs BLP. The memory cells 2 are arranged in such a way that a memory cell 2 is in each case arranged only at crossover points between word lines WL and one of the bit lines BL of a bit line pair BLP.

The memory cells 2 in each case have a memory transistor T and a storage capacitance C. The information of the memory cell 2 is stored as charge information in the storage capacitance C with respect to a center potential applied to the storage capacitance. The storage capacitance C can be connected to one of the bit lines BL of the bit line pair BLP via the memory transistor T. The memory transistor T is connected to the corresponding word line by its control input.

Upon the activation of the word line WL, i.e. upon a transition from a low potential to a high potential on the word line WL, the memory transistor T is switched to the on state, so that the storage capacitance C is connected to the bit line BL. The charge stored in the storage capacitance C flows onto the relevant bit line BL and brings about a charge difference between the two bit lines BL of the bit line pair BLP. The activation of the word lines WL is carried out by a word line decoder 3, which decodes a word line address and activates one of the word lines WL in accordance with the word line address in order thus to address the memory cell at the bit line pair BLP. The word line WL is activated each time the memory cell 2 is read from and written to.

Each bit line pair BLP is connected to a sense amplifier 4, which, after the activation of the memory cell 2 to be read, amplifies the charge difference existing on the bit lines BL. The sense amplifier 4 is configured in such a way as to pull the bit line BL which exhibits the higher potential of the two bit line potentials in the direction of a high charge potential and to pull the potential of the bit line BL which exhibits the lower of the two bit line potentials to a lower charge potential. This increases the charge difference on the two bit lines BL of the bit line pair BLP.

The word line WL remains activated until the amplification operation is essentially concluded, so that the charge of the storage capacitance C, which is initially lost on account of flow away onto the corresponding bit line, is charged to the corresponding charge potential again in the course of the amplification by the sense amplifier 4. Only then is the word line WL deactivated, so that the charge information, which has then been written back to the memory cell 2, is preserved. At the same time, the sense amplifier 4 outputs the potential difference on two data lines 5, so that the datum corresponding to the charge information of the memory cell read can be output externally via a data bus.

Once the addressed word line WL has been deactivated and the information read out has been read out via the data lines 5, the bit lines BL of the bit line pair BLP have to be returned to a common center potential in order subsequently to enable an evaluation of the same or of a next memory cell 2 at the bit line pair BLP. In this case, the center potential must lie within a potential range in which the sense amplifier 4 can optimally detect a small charge difference on the two bit lines BL and can amplify it in a positive and negative direction. Therefore, the charge difference in the range of the center potential should be able to be amplified to a sufficient magnitude both in the direction of a lower voltage potential and in the direction of a higher voltage potential.

The high and low charge potentials for the sense amplifier 4 are provided by a control circuit 6, which, for this purpose, is connected to the sense amplifier 4 via a first potential line 7 for the low charge potential and a second potential line 8 for the high charge potential. A ground potential is preferably supplied as the low charge potential via the first potential line 7.

Once the charge information has been written to the storage capacitance C after a read-out operation or a write operation, the storage capacitance loses charge through leakage currents. The leakage currents have the effect that the charge of the storage capacitance C approaches the center potential, so that less charge can flow onto the relevant bit line when the memory transistor is activated. Below a specific threshold value of the potential difference between the bit lines of the bit line pair, the sense amplifier 4 cannot then detect and reliably amplify the excessively small charge difference on the bit lines BL. Particularly if a positive charge is stored in the storage capacitance C, which pulls the connected bit line BL to a higher potential, the leakage currents are particularly large in contrast to a storage capacitance C which has stored a negative charge (with respect to the center potential) which pulls the bit line in the direction of a lower charge potential.

Before the charge of the storage capacitance C therefore falls below a specific threshold value, it is therefore necessary to refresh the charge information in the memory cell 2. During the refresh, in the same way as during a read-out or write operation, the word line WL connected to the memory cell 2 is activated. This has the effect that the residual charge in the storage capacitance C flows onto the connected bit line BL and the sense amplifier 4 pulls apart the charge potentials of the bit lines BL of the bit line pair BLP. That is to say that, usually, one of the potentials is pulled to a low charge potential and the potential of the respective other bit line is pulled to a high charge potential. The low and the high charge potential are prescribed for the sense amplifier 4 by the control circuit 6.

The memory cells 2 are refreshed at periodic time intervals in which one word line WL after the other is activated in order to refresh the memory cells 2 situated thereon. The word line decoder 3 and also other peripheral circuits (not shown) are driven during the refresh with the corresponding refresh frequency resulting from the refresh period. This brings about, in the word line decoder 3 and the other peripheral circuits, a current consumption which is essentially dependent on the refresh frequency.

It is an aim of this invention to reduce the refresh frequency, so that it is possible to reduce the current consumption of the memory circuit. This is achieved in that, during the refresh of the memory cells 2, the sense amplifier 4 is supplied with a low refresh potential and a high refresh potential via the first and second potential lines 7, 8. The high refresh potential, in particular, is greater than the high charge potential since a positive charge, in particular, in the storage capacitances is subject to higher leakage currents than a negatively stored charge in the storage capacitances C. The low refresh potential preferably essentially corresponds to the low charge potential, so that it is not necessary to provide a potential source for providing a separate low refresh potential.

For this reason, the memory circuit 6 has a first potential source 9 and a second potential source 10. The first potential source 9 supplies the high charge potential with which the sense amplifier 4 is supplied if a charge information item is intended to be read out from a memory cell 2. If no charge information is intended to be read out, rather only the contents of the memory cells situated at the bit line pair are refreshed, then the second potential source 10 is connected to the second potential line 8 in order to make the high refresh potential available to the sense amplifier 4.

A changeover switch 11 is arranged between the second potential line 8 and the first and second potential sources 9, 10, which changeover switch changes over between a read/write mode and a refresh mode in accordance with a control signal from a refresh circuit 13.

During the read/write mode, the high charge potential present at the sense amplifier 4 is upwardly limited by the fact that a fast access time to the memory cells is intended to be possible. The larger than charge difference into which the sense amplifier amplifies the potentials of the bit lines BL, the longer the time needed for the charge potentials of the bit line to be equalized to a common center potential again. This restricts the rapidity with which a memory cell can be accessed after a previous access to a memory cell at the same bit line. For this reason, in present-day customary memory circuits, the high charge potential is limited to approximately 1.8 volts.

Since the access time is essentially unimportant during the refresh operation, it is desirable in the refresh mode to increase the charges stored in the storage capacitance C with respect to the charge that is normally stored in the read/write mode, and in doing so to accept that the equalization of the charge potential on the bit lines BL will thereby be lengthened. This is not critical since it is possible to lengthen the time period between the periodic refreshing, thereby also lengthening the time duration between the activation of the individual word lines.

The refresh circuit 13 is activated in accordance with an externally prescribed refresh command and is connected to the word line decoder 3 in order to prescribe refresh addresses, in accordance with the word line WL, at which memory cells 2 are intended to be activated for refreshing.

The control unit 6 furthermore controls an equalization transistor 12, which is connected between the bit lines of each bit line pair BLP and connects the bit lines to one another in accordance with an equalization signal, thereby equalizing the charges on the bit lines. As a result, a center voltage VBLEQ is generally assumed, which is in the center between the bit line having the higher charge potential and the bit line having the lower charge potential.

Figure 2:
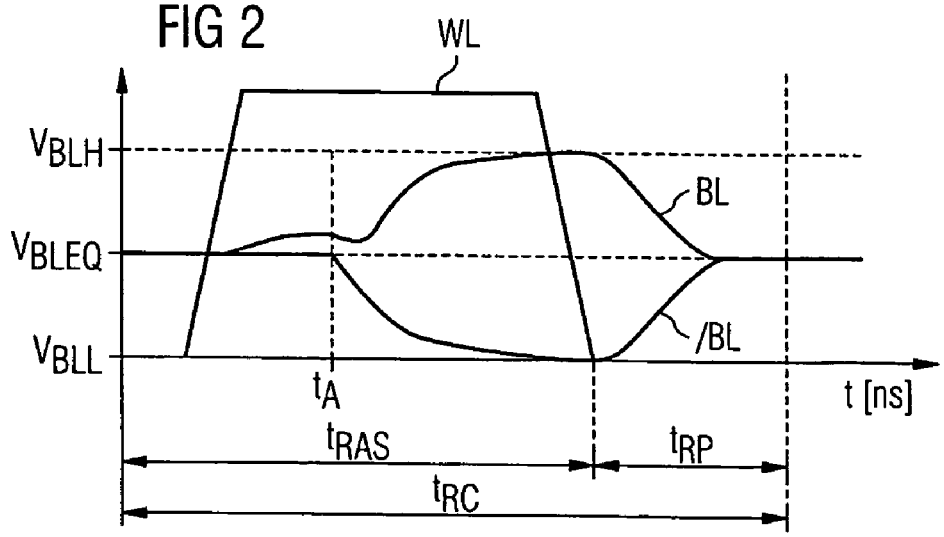
FIG. 2 shows a timing diagram for a method for refreshing a dynamic memory cell according to the prior art.

FIG. 2 illustrates a timing diagram indicating the temporal signal profiles between the word line activation signal and the potentials on the bit lines of the bit line pair. It can be seen that, after the activation of the word line WL, i.e. the word line WL is set from a low potential to a high potential, the memory transistor T connected to the corresponding bit line pair BLP is activated, so that the potential of the bit line BL to which the memory cell 2 is connected rises given a correspondingly high charge of the storage capacitance with respect to the center potential VBLEQ, while the potential of the complementary bit line /BL with respect thereto remains unchanged at the center potential. At an instant $T_A$, the sense amplifier 4 begins to amplify the detected charge difference and pulls the bit line having the lower charge potential, i.e. the bit line at which the memory cell is not arranged, in the direction of a low charge potential, e.g. the ground potential, and the bit line at which the higher charge potential is present in the direction of the high charge potential $V_{BLH}$.

The word line remains activated until the charge potentials on both bit lines have essentially reached the desired value prescribed by the bit line of the sense amplifiers 4, so that the potential is written back in the form of a charge to the storage capacitance C. As soon as the word line is deactivated, the charge information stored in the storage capacitance is maintained, independently of the fact that the potentials of the bit lines are equalized again after deactivation.

The equalization is effected with the aid of the equalization transistor 12 (see FIG. 1) driven by the control circuit 6. The time duration until deactivation of the word lines is called $T_{RAS}$ and the time duration between deactivation of the word line and the reaching of the center potential of the two word lines is called $T_{RP}$.

Figure 3:
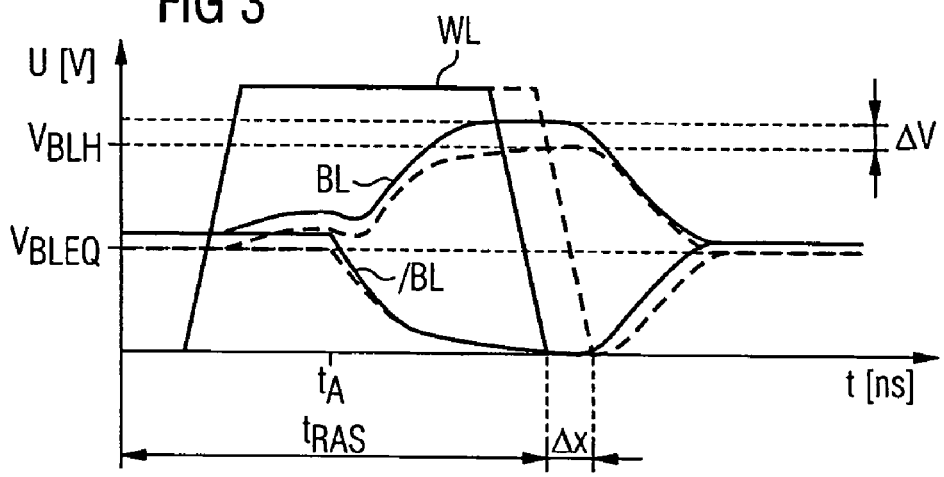
FIG. 3 shows a timing diagram for a method for refreshing a memory cell according to the invention.

FIG. 3 illustrates the word line activation signal and the charge potentials of the bit lines BL of the bit line pair BLP during the refresh operation in accordance with the method according to the invention. FIG. 3 illustrates the signal profiles of word line activation signal and charge potentials on the bit lines for a customary memory module in a dashed manner. The dashed illustration essentially corresponds to the signal profile according to FIG. 2.

As a result of the high charge potential being increased to the high refresh potential by a difference voltage value ΔV, first of all the center potential VBLEQ changes, which is assumed upon activation of the equalization transistor 12 on the bit lines BL. Proceeding from there, the charge information of the storage capacitance C is applied to the bit line and the sense amplifier 4 is subsequently activated, i.e. at the instant $T_A$, so that the potential of the bit line with the higher charge potential is pulled to the high read-out potential and the potential of the bit line with the lower charge potential is pulled to the low read-out potential, which corresponds to the low charge potential in the example shown.

The deactivation of the word line WL essentially ends the process of writing the charge information back to the storage capacitance C. This can be effected as soon as the high or the low refresh potential has been reached on the bit line. However, it can also already be effected before the high refresh potential is reached and after the instantaneous potential on the bit line exceeds the high charge potential. As a result of the high refresh potential, the gradient of the voltage profiles on the bit lines is essentially higher, so that the high charge potential is reached or exceeded in a shorter time. This furthermore makes it possible to shorten the activation time of the word line activation signal and thus to reduce the time duration in which leakage currents flow away from the word line during the activation duration (by a time labeled as ΔX). This, too, enables a contribution to be made to reducing the current consumption of the memory circuit.

Figure 4:
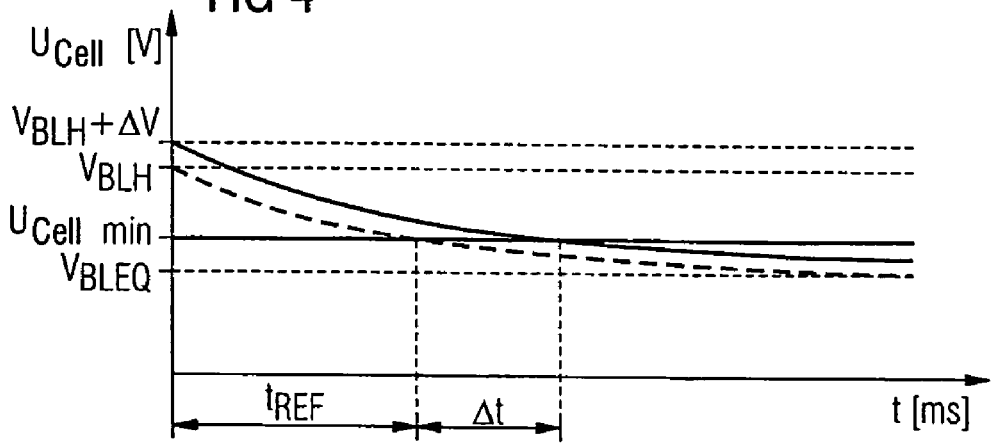
FIG. 4 shows a diagram for illustrating a discharging of the memory cell on account of leakage currents.

FIG. 4 illustrates how the retention time $T_{Ref}$, which is the time duration during which the charge information of the memory cell—given a storage charge greater than the center voltage—can be read out reliably and without any errors or can be refreshed reliably and without any errors, depends on the high charge potential or on the high refresh potential. It can be seen that the increase in the high refresh potential with respect to the high charge potential $V_{BLH}$ results in a not insignificant increase in the retention time by ΔT, during which the charge information of the memory cell is maintained. The cause of the increase in the time duration $T_{ref}$ is that the bit line potential resulting from the minimal potential difference between the bit lines after the memory cell has been connected onto one of the bit lines is undershot only after a longer time duration. An increase in the charge potential of the memory cell thus leads to a lengthening of the retention time $T_{ref}$ by a difference time ΔT.

What is essential in the case of embodiments of the invention is to increase the distance between the center voltage $V_{BLEQ}$ and the high refresh potential, thereby increasing the voltage range by which the charge potential of the storage capacitance is permitted to decay. For one embodiment, this is made possible by virtue of the high charge potential being increased to a high refresh potential during the refresh. The center voltage $V_{BLEQ}$ likewise being increased as in the circuit diagram illustrated in FIG. 1, essentially results from the equalization of the high charge potential and the low charge potential. As a result, the voltage difference by which the charge potential of the memory cell is permitted to decay more is increased by about half the difference between the high refresh potential and the high charge potential.

Figure 5:
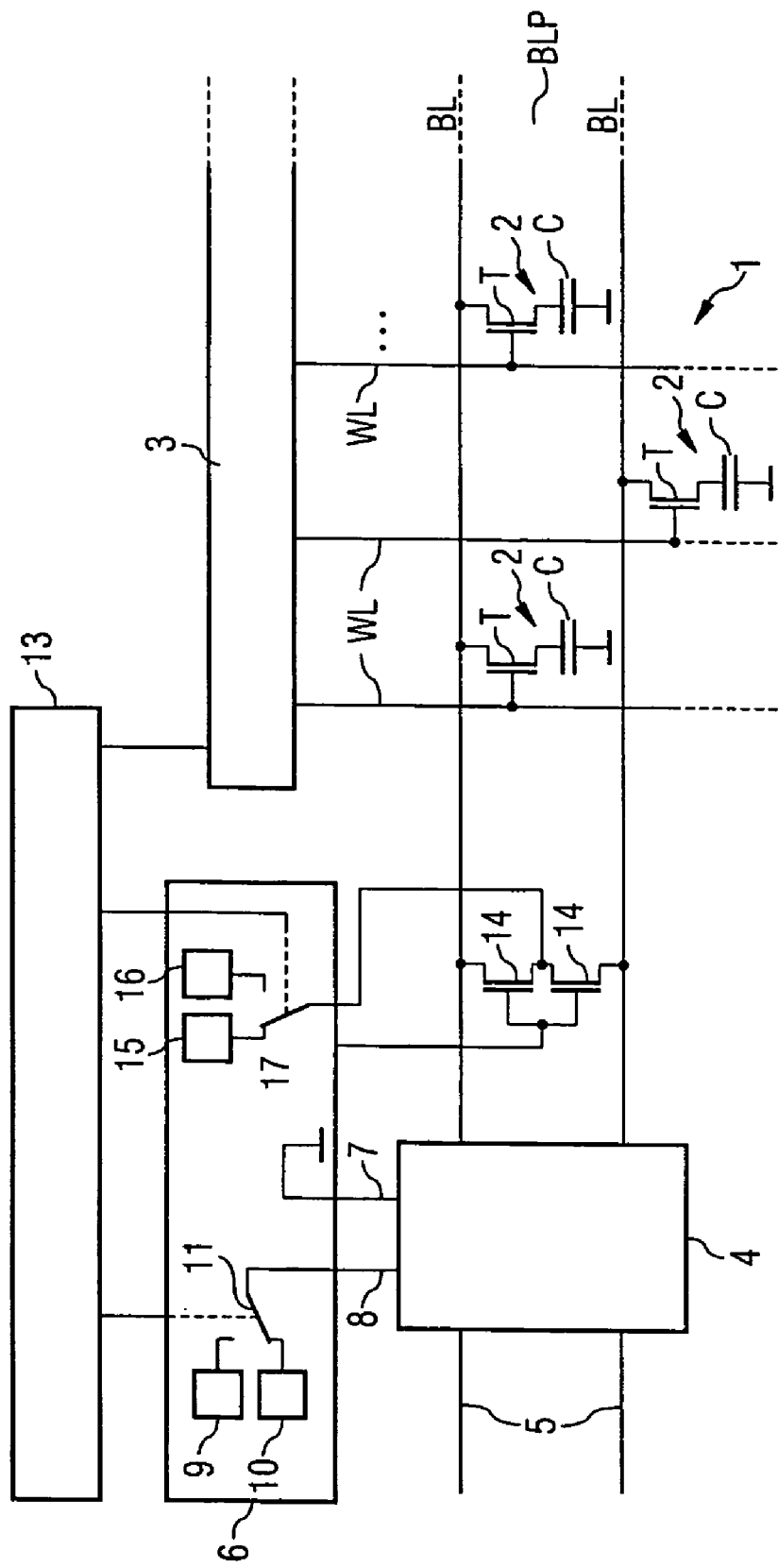
FIG. 5 shows a detail from a further memory circuit according to the invention.

FIG. 5 illustrates a further embodiment of the invention. In this embodiment, the center potential is not reached by means of an equalization transistor 12 by equalization of the charge potentials of the bit lines after deactivation of the corresponding word line, but rather the center potential is prescribed by a fixed potential source. This is essentially effected by means of two further equalization transistors 14, the control terminals of which are connected to the control unit 6, and the two further equalization transistors 14 are thus simultaneously activated or turned off in accordance with a corresponding control signal.

The further equalization transistors 14 are connected in series, with a center potential from a third potential source 15 being applied between the transistors 14. The third potential source 15 provides a center potential to which the bit lines of each bit line pair are charged in the read/write mode after deactivation of the word line. A fourth potential source 16 is provided, which can be connected to the further equalization transistors 14 in the same way as the third potential source 15 via a further change switch 17. The fourth potential source 16 provides an equalization center potential, which is less than the center potential provided by the third potential source 15. The further changeover switch 17 is connected in under the control of the refresh circuit 13 such that, during the refresh, the bit lines are charged to the reduced refresh center potential as soon as the respective word line WL has been deactivated.

It is also possible, in accordance with a further embodiment, to increase the high refresh potential with respect to the high charge potential, but to keep the center potential at the same potential level both during the read/write operation and during the refresh operation. This likewise makes it possible to increase the voltage range over which the charge potential of the storage capacitance C is permitted to decay during the refresh operation.

In either case, what is involved is essentially a mater of increasing the potential range in which the memory cell can still be read correctly during the refresh.

While the current consumption for charge reversal of the bit lines may be increased by virtue of an increased high refresh potential, this increased current consumption is compensated for again by the lengthened refresh period and thus fewer refresh accesses per unit time. Therefore, one potential advantage of the method for refreshing the memory cell resides in the saving of current in peripheral circuits which drive the memory cell array 1. A typical current distribution in the case of a conventional memory module with and without the refresh method according to the invention is specified in the following Table 1:

TABLE I

| | Proportion of the current consumption in conventional memory circuits | Proportion of the current consumption in a memory circuit according to the invention |
|---|---|---|
| $I_{BLH}$ (current for charging the bit line to high potential): | 51.2% | 51.2% |
| $I_{INT}$ (current taken up by the peripheral circuit): | 35.8% | 32.2% (−10%) |
| $I_{pp}$ (current for charging the word lines): | 3.1% | 2.8% (−10%) |
| $I_{GEN}$ (current taken up by voltage generators): | 9.9% | 9.9% |
| TOTAL: | 100.0% | 96.1% |

The values specified relate to a memory circuit in which the high charge potential would be increased by 0.1 volt. In the example shown, this leads to a lengthening of the refresh period by 10% and thus results in a reduction of the overall current saving of approximately 4%.

When changing between read/write operation and refresh operation, the refresh period is permitted to be lengthened in accordance with the increased refresh voltage only when the high refresh potential has been written at least once to all the memory cells which are intended to be refreshed.

In particular, it is advantageous to carry out the method according to the invention during a self-refresh mode. During the self-refresh mode, the control of the refresh operation is performed by the memory circuit, in particular by the refresh circuit 13, and is not prescribed externally. In order to control the self-refresh mode, a start signal and a stop signal are sent from a control circuit to the memory module, with no other instructions being sent to the memory module between the start signal and the stop signal.

If, in the self-refresh mode, a refresh is executed during the time-critical ending of the refresh mode, then a conventional refresh operation with the customary timings may be executed in order to avoid timing conflicts resulting therefrom.

While the foregoing is directed to embodiments of the present invention, other and further embodiments of the invention may be devised without departing from the basic scope thereof, and the scope thereof is determined by the claims that follow.

What is claimed is:

1. A method for refreshing a dynamic memory cell in a memory circuit, the memory cell being arranged at a word line and a bit line of a bit line pair, comprising:

during read-out of the memory cell, activating the word line and amplifying, with a sense amplifier, a charge difference brought about thereby on the bit lines to generate a high charge potential and a low charge potential;

after the readout, charging the potentials of the bit lines to a first center potential;

during refresh of the memory cell, activating the word line and amplifying, with the sense amplifier, the charge potentials of the bit lines, depending on charge information of the memory cell, to generate a high refresh potential and a low refresh potential; and after the refresh, charging the potentials of the bit lines to a second center potential, wherein the potential difference between the high refresh potential to which the sense amplifier drives the bit lines during refresh and the second center potential is greater than the potential difference between the high charge potential to which the sense amplifier drives the bit lines during readout and the first center potential.

2. The method of claim 1, wherein the high refresh potential is greater than the high charge potential.

3. The method of claim 2, wherein the first center potential lies between the low and the high refresh potentials.

4. The method of claim 1, wherein the first and second center potentials are substantially equal.

5. The method of claim 1, wherein the first center potential is greater than the second center potential.

6. The method of claim 1, wherein the word line remains activated for a shorter time duration during the refresh than during the read-out.

7. The method of claim 1, wherein the refresh of the memory cell is carried out in a self-refresh operation.

8. The method of claim 1, wherein a time duration of the refresh period after which the memory cell is periodically refreshed is increased after a first refresh following a write or read access to the memory cell.

9. The method of claim 8, wherein, during the refresh, the word line is activated only until that bit line which has the higher potential has a charge potential which is higher, by a defined potential magnitude, than the charge potential the bit line has after a write or read access.

10. A memory circuit, comprising:
a memory cell array with a memory cell arranged at a word line and a bit line pair;
a refresh circuit for generating signals to refresh the memory cell;
a charge equalization circuit to charge the bit lines to a common center potential after a read-out or refresh of the memory cell;
a sense amplifier in order to separate a charge difference between the bit lines into a high charge potential and a low charge potential when the wordline is activated during a read-out or refresh of the memory; and
voltage control means for varying the potential difference between the high charge potential and the common center potential, wherein the potential difference between the high charge potential and the common center potential during a refresh of the memory cell is greater than the potential difference between the high charge potential and the common center potential during a read-out of the memory cell.

11. The memory circuit of claim 10, wherein the voltage control means provides the sense amplifier with the high charge potential from a first high potential source during refresh of the memory cell and from a second high potential source during read-out of the memory cell.

12. The memory circuit of claim 11, wherein the voltage control means comprises a switch connectable to the first high potential source in response to a signal provided by the refresh circuit.

13. The memory circuit of claim 10, wherein the voltage control means provides the charge equalization circuit with the common center potential from a first center potential source during refresh of the memory cell and from a second center potential source during read-out of the memory cell, wherein the first center potential is less than the second center potential.

14. The memory circuit of claim 10, wherein the word line remains activated for a shorter time duration during the refresh than during the read-out.

15. The memory circuit of claim 14, wherein a time duration of the refresh period after which the memory cell is periodically refreshed is increased after a first refresh following a write or read access to the memory cell.

16. The memory circuit of claim 14, wherein, during the refresh, the word line is activated only until that bit line which has the higher potential has a charge potential which is higher, by a defined potential magnitude, than the charge potential the bit line has after a read-out.

17. A memory circuit, comprising:
a memory cell array with a memory cell arranged at a word line and a bit line pair;
a refresh circuit for generating signals to refresh the memory cell;
a charge equalization circuit to charge the bit lines to a common center potential after a read-out or refresh of the memory cell;
a sense amplifier in order to separate a charge difference between the bit lines into a high charge potential and a low charge potential when the wordline is activated during a read-out or refresh of the memory;
first and second potential sources, wherein the first potential source is greater than the second potential source; and
a voltage control circuit configured to provide the sense amplifier with the high charge potential from the first potential source during refresh of the memory cell and from a second high potential source during read-out of the memory cell.

18. The memory circuit of claim 17, wherein the voltage control circuit comprises a switch connectable to the first potential source in response to a signal provided by the refresh circuit.

19. The memory circuit of claim 17, further comprising:
third and fourth potential sources, wherein the third potential source is lower than the fourth potential source; and
wherein the voltage control circuit is configured to provide the charge equalization circuit with the common center potential from the third potential source during refresh of the memory cell and from the fourth potential source during read-out of the memory cell.

* * * * *